(12) United States Patent
Choi et al.

(10) Patent No.: US 11,567,401 B2
(45) Date of Patent: Jan. 31, 2023

(54) NANOFABRICATION METHOD WITH CORRECTION OF DISTORTION WITHIN AN IMPRINT SYSTEM

(71) Applicant: CANON KABUSHIKI KAISHA, Tokyo (JP)

(72) Inventors: Byung-Jin Choi, Austin, TX (US); Anshuman Cherala, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 217 days.

(21) Appl. No.: 16/723,795

(22) Filed: Dec. 20, 2019

(65) Prior Publication Data
US 2021/0191257 A1 Jun. 24, 2021

(51) Int. Cl.
G03F 7/00 (2006.01)
H01L 21/027 (2006.01)

(52) U.S. Cl.
CPC ........ *G03F 7/0002* (2013.01); *H01L 21/0271* (2013.01)

(58) Field of Classification Search
None
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 9,415,418 B2 | 8/2016 | Sreenivasan et al. |
| 9,793,120 B2 | 10/2017 | Nishimura et al. |
| 9,987,653 B2 | 6/2018 | Sreenivasan et al. |
| 9,993,962 B2 | 6/2018 | Cherala |
| 10,192,741 B2 | 1/2019 | Nishimura et al. |
| 10,553,501 B2 | 2/2020 | Cherala et al. |
| 2007/0081138 A1* | 4/2007 | Kerkhof ................ G03F 9/7069 355/71 |

(Continued)

FOREIGN PATENT DOCUMENTS

| | | |
|---|---|---|
| JP | 2017-212439 A | 11/2017 |
| JP | 2019-140394 A | 8/2019 |
| JP | 2019-176139 A | 10/2019 |

*Primary Examiner* — James M Mellott
(74) *Attorney, Agent, or Firm* — Canon U.S.A., Inc., IP Division

(57) ABSTRACT

A nanofabrication method comprises receiving information regarding a distortion within an imprint system, generating a first drop pattern of formable material based on the received information, dispensing a first plurality of drops onto a substrate according to the first drop pattern, contacting the dispensed first plurality of drops with a patternless superstrate to form a first layer of formable material, forming a first cured layer by curing the first layer of formable material while the superstrate is contacting the first layer of formable material, separating the superstrate from the first cured layer, depositing an etch resistant layer on the first cured layer, generating a second drop pattern of formable material, dispensing a second plurality of drops onto the etch resistant layer according to the second drop pattern, and contacting the dispensed second plurality of drops with a patterned template to form a second layer of formable material.

19 Claims, 11 Drawing Sheets

(56) References Cited

U.S. PATENT DOCUMENTS

| | | | |
|---|---|---|---|
| 2009/0200266 A1* | 8/2009 | Doyle | B82Y 10/00 |
| | | | 216/60 |
| 2013/0068720 A1 | 3/2013 | Taniguchi | |
| 2014/0072830 A1* | 3/2014 | Lille | B81C 1/00031 |
| | | | 428/800 |
| 2018/0247823 A1* | 8/2018 | LaBrake | H01L 21/31051 |

* cited by examiner

NANOFABRICATION METHOD WITH CORRECTION OF DISTORTION WITHIN AN IMPRINT SYSTEM

BACKGROUND

Field of Art

The present disclosure relates to a nanofabrication method, and in particular, a nanofabrication method that corrects for distortion within an imprint system.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

U.S. Pat. No. 9,993,962 discloses a method for imprinting to correct for a distortion within an imprint system to improve overlay. The method disclosed in the '962 patent performs the correction using a modified drop pattern dispensed during an imprint process. However, using the modified drop pattern during the imprint process has a disadvantage because the modified drop pattern results in a non-uniform residual layer thickness (RLT) that is not as close to the target uniform RLT as it would have been without the modification. That is, while the method disclosed in the '962 patent improves overlay, it is at the expense of the target uniform RLT. Thus, there is a need in the art for a nanofabrication method that corrects for distortion within an imprint system to improve overlay, without adversely affecting the target RLT.

SUMMARY

A fabrication method comprises receiving information regarding a distortion within an imprint system, generating a first drop pattern of formable material based on the received information, the first drop pattern comprising a first plurality of drops of formable material, dispensing the first plurality of drops onto a substrate according to the first drop pattern, contacting the dispensed first plurality of drops with a superstrate to form a first layer of formable material, the superstrate being patternless, forming a first cured layer by curing the first layer of formable material while the superstrate is contacting the first layer of formable material, separating the superstrate from the first cured layer, depositing an etch resistant layer on the first cured layer, generating a second drop pattern, the second drop pattern comprising a second plurality of drops of formable material, dispensing the second plurality of drops onto the etch resistant layer according to the second drop pattern, and contacting the dispensed second plurality of drops with a template to form a second layer of formable material, the template having a pattern.

A nanofabrication system comprises a planarizing system, an imprint system, one or more processors, and one or more memories storing instructions. When executed by the one or more processors, the instructions causes the nanofabrication system to: receive information regarding a distortion within the imprint system, generate a first drop pattern of formable material based on the received information, the first drop pattern comprising a first plurality of drops of formable material, cause the planarizing system to dispense the first plurality of drops onto a substrate according to the first drop pattern, contact the dispensed first plurality of drops with a superstrate to form a first layer of formable material, the superstrate being patternless, form a first cured layer by curing the first layer of formable material while the superstrate is contacting the first layer of formable material, and separate the superstrate from the first cured layer, deposit an etch resistant layer on the first cured layer, generate a second drop pattern, the second drop pattern comprising a second plurality of drops of formable material, and cause the imprint system to: dispense the second plurality of drops onto the etch resistant layer according to the second drop pattern, and contact the dispensed second plurality of drops with a template to form a second layer of formable material, the template having a pattern.

A method of making an article comprises receiving information regarding a distortion within an imprint system, generating a first drop pattern of formable material based on the received information, the first drop pattern comprising a first plurality of drops of formable material, dispensing the first plurality of drops onto a substrate according to the first drop pattern, contacting the dispensed first plurality of drops with a superstrate to form a first layer of formable material, the superstrate being patternless, forming a first cured layer by curing the first layer of formable material while the superstrate is contacting the first layer of formable material, separating the superstrate from the first cured layer, depositing an etch resistant layer on the first cured layer, generating a second drop pattern, the second drop pattern comprising a second plurality of drops of formable material, dispensing the second plurality of drops onto the etch resistant layer according to the second drop pattern, contacting the dispensed second plurality of drops with a template to form a second layer of formable material, the template having a pattern, forming the pattern in the second layer of formable material as a result of completing the contacting of the template with the dispensed second plurality of drops, transferring the pattern in the second layer of formable material to the substrate, and processing the substrate to make the article These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1A:
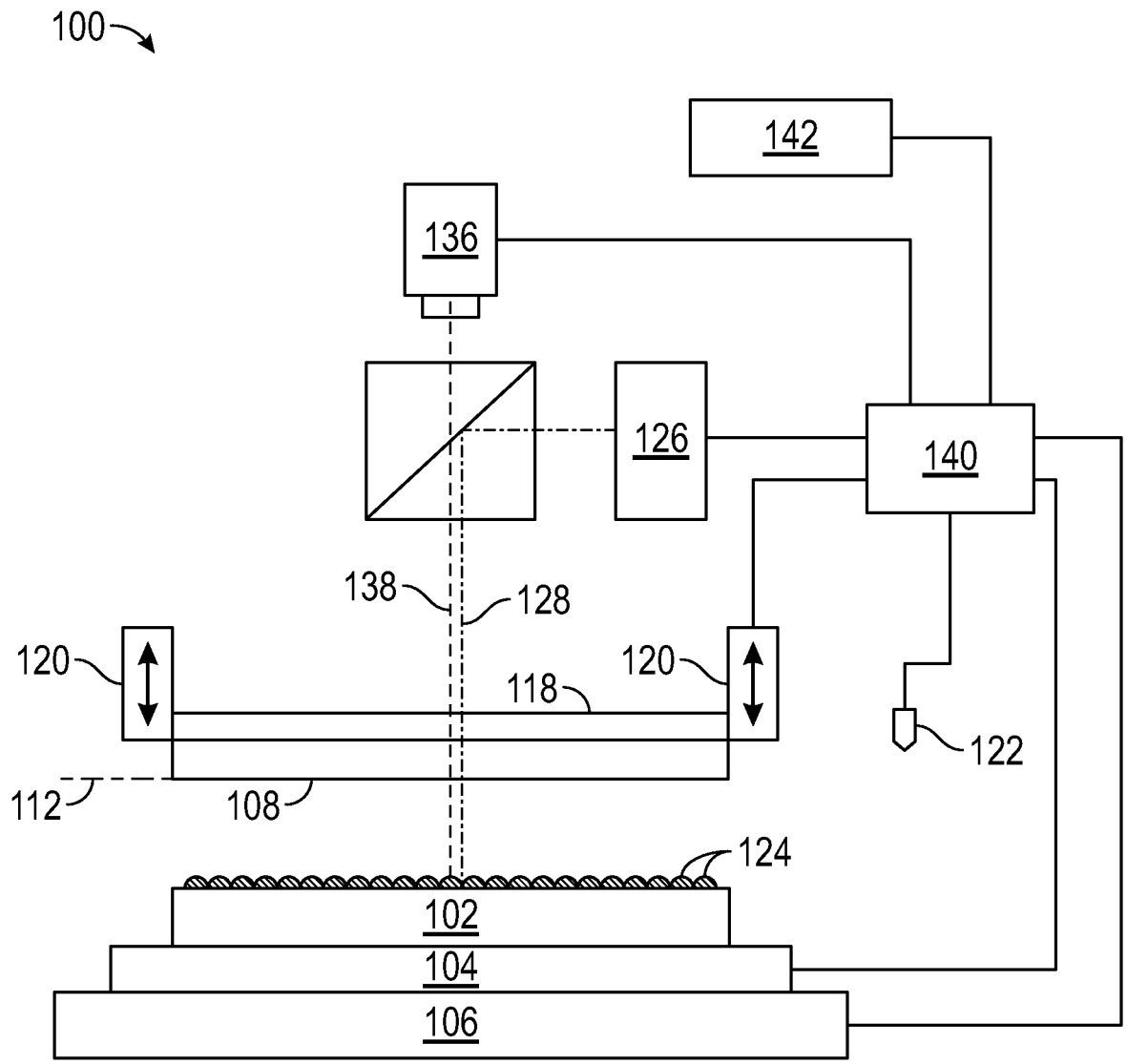
FIG. 1A is an illustration of an exemplary planarizing system of a nanofabrication system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Nanofabrication System

Figure 1B:
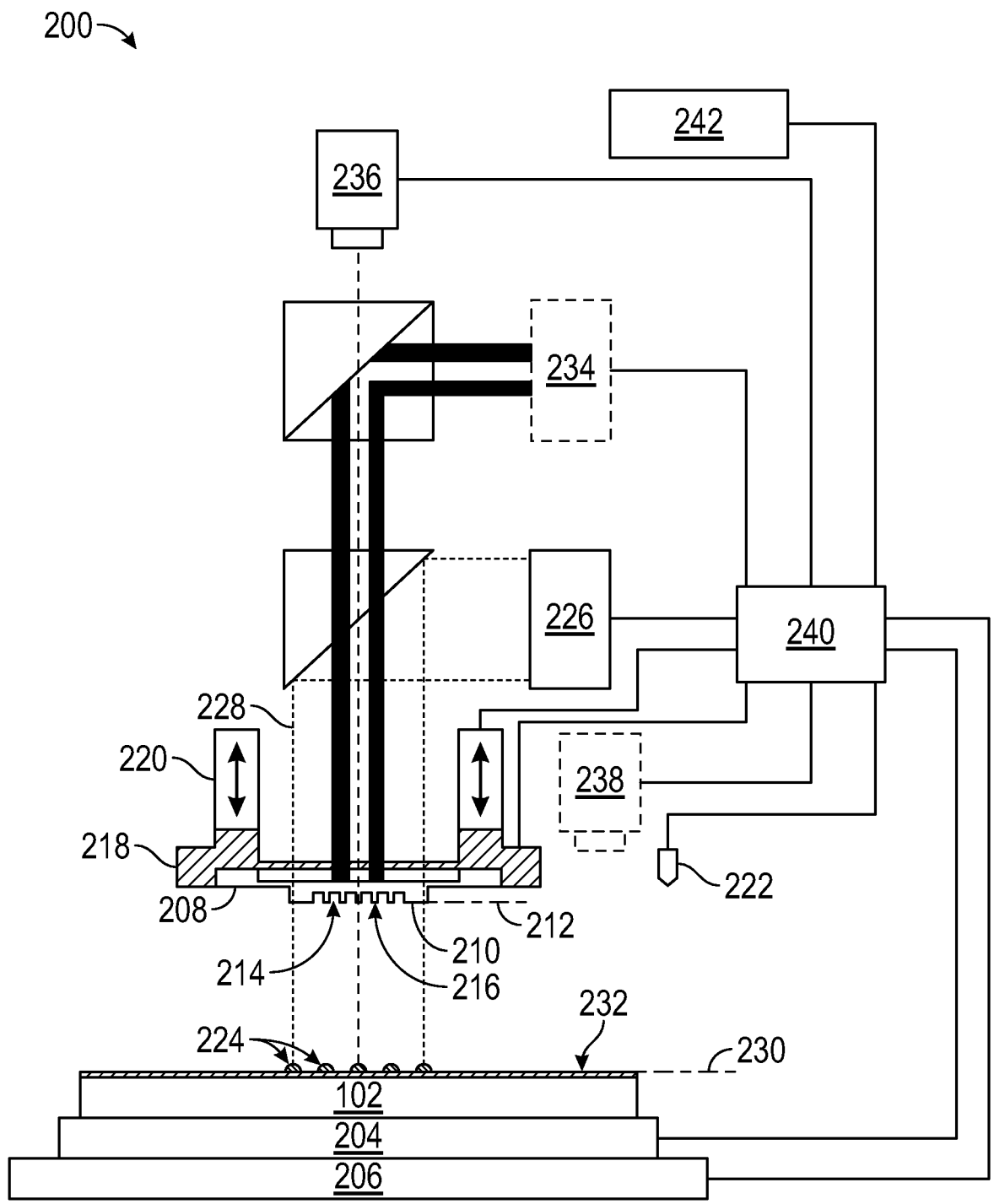
FIG. 1B is an illustration of an exemplary imprint system of the nanofabrication system in accordance with an example embodiment.

The nanofabrication system disclosed herein includes a planarizing system 100 and an imprint system 200, both of which are used as part of a process to fabricate an article of manufacture (e.g. a semiconductor device). FIG. 1A is an illustration of an example embodiment of the planarizing system 100 and FIG. 1B is an illustration of an example embodiment of the imprint system 200.

The planarizing system 100 shown in FIG. 1A is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The planarizing system 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The planarizing system 100 may further comprise a curing system that includes a radiation source 126 that directs actinic energy, for example, UV radiation, along an exposure path 128. The planarization head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The planarizing system 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the planarization system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The planarizing system 100 may be regulated, controlled, and/or directed by one or more processors 140 (controller) in communication with one or more components and/or subsystems such as the substrate chuck 104, the substrate positioning stage 106, the superstrate chuck 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the planarization head 120, the substrate position stage 106, or both vary a distance between the superstrate 118 and the substrate 102 to define a desired space (a bounded physical extent in three dimensions) that is filled with the formable material 124. For example, the planarization head 120 may be moved toward the substrate and apply a force to the superstrate 108 such that the superstrate contacts and spreads droplets of the formable material 124 as further detailed herein.

FIG. 1B illustrates and example imprint system 200, having many features corresponding to those in the planarizing system 100. Features that correspond have similar numbers. The imprint system 200 is used to shape a film on the substrate 102. The substrate 102 may be coupled to the substrate chuck 204.

The substrate 102 and the substrate chuck 204 may be further supported by a substrate positioning stage 206. The substrate positioning stage 206 may provide translational and/or rotational motion along one or more of the x, y, z, θ, and φ-axes. The substrate positioning stage 206, the substrate 102, and the substrate chuck 204 may also be positioned on a base (not shown). The substrate positioning stage may be a part of a positioning system.

Spaced-apart from the substrate 102 is a template 208. The template 208 may include a body having a mesa (also referred to as a mold) 210 extending towards the substrate 202 on a front side of the template 208. The mesa 210 may have a patterning surface 212 thereon also on the front side of the template 208. Alternatively, the template 208 may be formed without the mesa 210, in which case the surface of the template facing the substrate 102 is equivalent to the mold 210 and the patterning surface 212 is that surface of the template 108 facing the substrate 202.

The template 208 may be formed from such materials including, but not limited to, fused-silica, quartz, silicon, organic polymers, siloxane polymers, borosilicate glass, fluorocarbon polymers, metal, hardened sapphire, and/or the like. The patterning surface 212 may have features defined by a plurality of spaced-apart template recesses 214 and/or template protrusions 216. The patterning surface 212 defines a pattern that forms the basis of a pattern to be formed on the substrate 202. In an alternative embodiment, the patterning surface 212 is featureless in which case a planar surface is formed on the substrate.

The template may be coupled to a template chuck 218. The template chuck 218 may be, but is not limited to, vacuum chuck, pin-type chuck, groove-type chuck, electrostatic chuck, electromagnetic chuck, and/or other similar chuck types. The template chuck 218 may be configured to apply stress, pressure, and/or strain to template 208 that varies across the template 208. The template chuck 218 may include piezoelectric actuators which can squeeze and/or stretch different portions of the template 208. The template chuck 218 may include a system such as a zone based vacuum chuck, an actuator array, a pressure bladder, etc. which can apply a pressure differential to a back surface of the template causing the template to bend and deform.

The template chuck 218 may be coupled to an imprint head 220 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 218 relative to the substrate in at least the z-axis direction, and potentially other directions (e.g. x, y, θ, ψ, and φ-axes).

The imprint system 100 may further comprise a fluid dispenser 222. The fluid dispenser 222 may also be moveably coupled to the bridge. In an embodiment, the fluid dispenser 222 and the imprint head 120 share one or more or all positioning components. In an alternative embodiment, the fluid dispenser 222 and the imprint head 220 move independently from each other. The fluid dispenser 222 may be used to deposit liquid formable material 224 (e.g., polymerizable material) onto the substrate 102 in a pattern. Additional formable material 224 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 224 being deposited onto the substrate 202. The formable material 224 may be dispensed upon the substrate 102 before and/or after a desired volume is defined between the mold 212 and the substrate 102 depending on design considerations. The formable material 224 may comprise a mixture including a monomer as described in U.S. Pat. Nos. 7,157,036 and 8,076,386, both of which are herein incorporated by reference.

Different fluid dispensers 222 may use different technologies to dispense formable material 224. When the formable material 224 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The imprint system 200 may further comprise a radiation source 226 that directs actinic energy along an exposure path 228. The imprint head and the substrate positioning stage 206 may be configured to position the template 208 and the substrate 102 in superimposition with the exposure path 228. The radiation source 226 sends the actinic energy along the exposure path 228 after the template 208 has made contact with the formable material 228. FIG. 1B illustrates the exposure path 228 when the template 208 is not in contact with the formable material 224, this is done for illustrative purposes so that the relative position of the individual components can be easily identified. An individual skilled in the art would understand that exposure path 228 would not substantially change when the template 208 is brought into contact with the formable material 224.

The imprint system 200 may further comprise a field camera 236 that is positioned to view the spread of formable material 224 after the template 208 has made contact with the formable material 224. FIG. 1B illustrates an optical axis of the field camera's imaging field as a dashed line. As illustrated in FIG. 1B the nanoimprint lithography system 200 may include one or more optical components (dichroic mirrors, beam combiners, prisms, lenses, mirrors, etc.) which combine the actinic radiation with light to be detected by the field camera. The field camera 236 may be configured to detect the spread of formable material under the template 208. The optical axis of the field camera 236 as illustrated in FIG. 1B is straight but may be bent by one or more optical components. The field camera 236 may include one or more of a CCD, a sensor array, a line camera, and a photodetector which are configured to gather light that has a wavelength that shows a contrast between regions underneath the template 208 that are in contact with the formable material, and regions underneath the template 208 which are not in contact with the formable material 224. The field camera 236 may be configured to gather monochromatic images of visible light. The field camera 236 may be configured to provide images of the spread of formable material 224 underneath the template 208, the separation of the template 208 from cured formable material, and can be used to keep track the progress over the imprinting process.

The imprint system 200 may further comprise a droplet inspection system 238 that is separate from the field camera 236. The droplet inspection system 238 may include one or more of a CCD, a camera, a line camera, and a photodetector. The droplet inspection system 238 may include one or more optical components such as a lenses, mirrors, apertures, filters, prisms, polarizers, windows, adaptive optics, and/or light sources. The droplet inspection system 238 may be positioned to inspect droplets prior to the patterning surface 212 contacting the formable material 224 on the substrate 102.

The imprint system 200 may further include a thermal radiation source 234 which may be configured to provide a spatial distribution of thermal radiation to one or both of the template 208 and the substrate 102. The thermal radiation source 234 may include one or more sources of thermal electromagnetic radiation that will heat up one or both of the substrate 102 and the template 208 and does not cause the formable material 224 to solidify. The thermal radiation source 234 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 236 onto a single optical path that intersects with the imprint field when the template 208 comes into contact with the formable material 224 on the substrate 102. The thermal radiation source 234 may send the thermal radiation along a thermal radiation path (which in FIG. 1B is illustrated as 2 thick dark lines) after the template 208 has made contact with the formable material 228. FIG. 1B illustrates the thermal radiation path when the template 208 is not in contact with the formable material 224, this is done for illustrative purposes so that the relative position of the individual components can be easily identified. An individual skilled in the art would understand that the thermal radiation path would not substantially change when the template 208 is brought into contact with the formable material 224. In FIG. 1B the thermal radiation path is shown terminating at the template 208, but it may also terminate at the substrate 102. In an alternative embodiment, the thermal radiation source 234 is underneath the substrate 102, and thermal radiation path is not combined with the actinic radiation and visible light.

Prior to the formable material 224 being dispensed onto the substrate, a substrate coating 232 may be applied to the substrate 102. In an embodiment, the substrate coating 232 may be an adhesion layer. In an embodiment, the substrate coating 232 may be applied to the substrate 102 prior to the substrate being loaded onto the substrate chuck 204. In an alternative embodiment, the substrate coating 232 may be applied to substrate 102 while the substrate 102 is on the substrate chuck 204. In an embodiment, the substrate coating 232 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The imprint system 200 may be regulated, controlled, and/or directed by one or more processors 240 (controller) in communication with one or more components and/or subsystems such as the substrate chuck 204, the substrate positioning stage 206, the template chuck 218, the imprint head 220, the fluid dispenser 222, the radiation source 226, the thermal radiation source 234, the field camera 236 and/or the droplet inspection system 238. The processor 240 may operate based on instructions in a computer readable program stored in a non-transitory computer readable memory 242. The processor 240 may be or include one or more of a CPU, MPU, GPU, ASIC, FPGA, DSP, and a general purpose computer. The processor 240 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 220, the substrate positioning stage 206, or both varies a distance between the mold 210 and the substrate 102 to define a desired space (a bounded physical extent in three dimensions) that is filled with the formable material 224. For example, the imprint head 220 may apply a force to the template 208 such that mold 210 is in contact with the formable material 224. After the desired volume is filled with the formable material 224, the radiation source 226 produces actinic radiation (e.g. UV, 248 nm, 280 nm, 350 nm, 365 nm, 395 nm, 400 nm, 405 nm, 435 nm, etc.) causing formable material 224 to cure, solidify, and/or cross-link; conforming to a shape of the substrate surface 230 and the patterning surface 212, defining a patterned layer on the substrate 102. The formable material 224 is cured while the template 208 is in contact with formable material 224 forming the patterned layer on the substrate 102. Thus, the imprint system 200 uses an imprinting process to form the patterned layer which has recesses and protrusions which are an inverse of the pattern in the patterning surface 212.

The imprinting process may be done repeatedly in a plurality of imprint fields that are spread across the substrate surface 230. Each of the imprint fields may be the same size as the mesa 210 or just the pattern area of the mesa 210. The pattern area of the mesa 210 is a region of the patterning surface 212 which is used to imprint patterns on a substrate 102 which are features of the device or are then used in subsequent processes to form features of the device. The pattern area of the mesa 210 may or may not include mass velocity variation features which are used to prevent extrusions. In an alternative embodiment, the substrate 102 has only one imprint field which is the same size as the substrate 102 or the area of the substrate 102 which is to be patterned with the mesa 210. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 224 between the substrate surface 230 and the patterning surface 212 in each imprint field. The patterned layer may also include one or more features such as protrusions which extend above the residual layer having a thickness. These protrusions match the recesses 214 in the mesa 210.

In summary, the main difference between the planarizing system 100 and the imprint system 200 is that the planarizing system 100 uses a generally patternless superstrate to flatten/planarize the formable material dispensed on the substrate, while the imprint system 200 uses a generally patterned template to imprint a pattern into the formable material dispensed on the substrate. That is, the main difference between the two systems is the patternless superstrate versus a patterned template, with the remaining elements of the systems being substantially the same.

Template/Superstrate

Figure 2A:
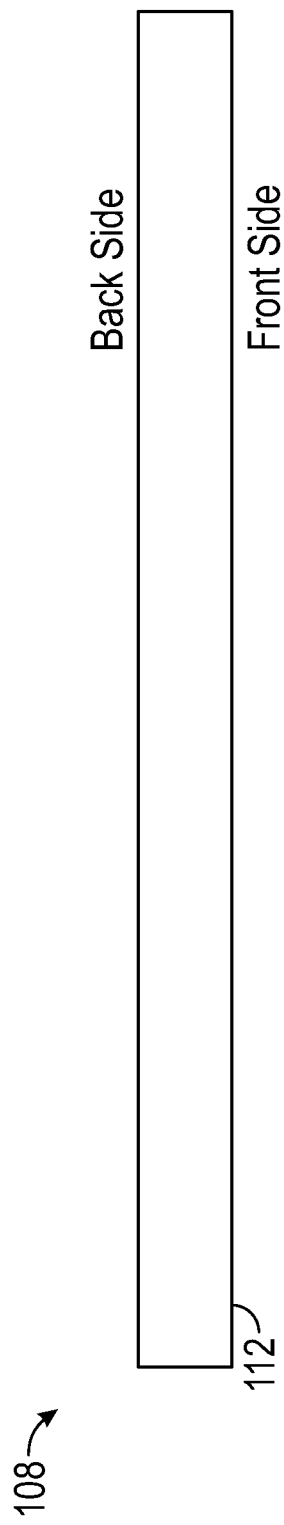
FIG. 2A is an illustration of an exemplary superstrate in accordance with an example embodiment.

FIG. 2A is an illustration of a superstrate 108 that may be used during the planarizing process. As noted above, the surface 112 of the superstrate may be patternless. That is, when a planarization step is being performed, a superstrate 108 in which there is no pattern on the surface 112 is used. The surface 112 may generally be of the same areal size or slightly smaller as the surface of the substrate 102.

Figure 2B:
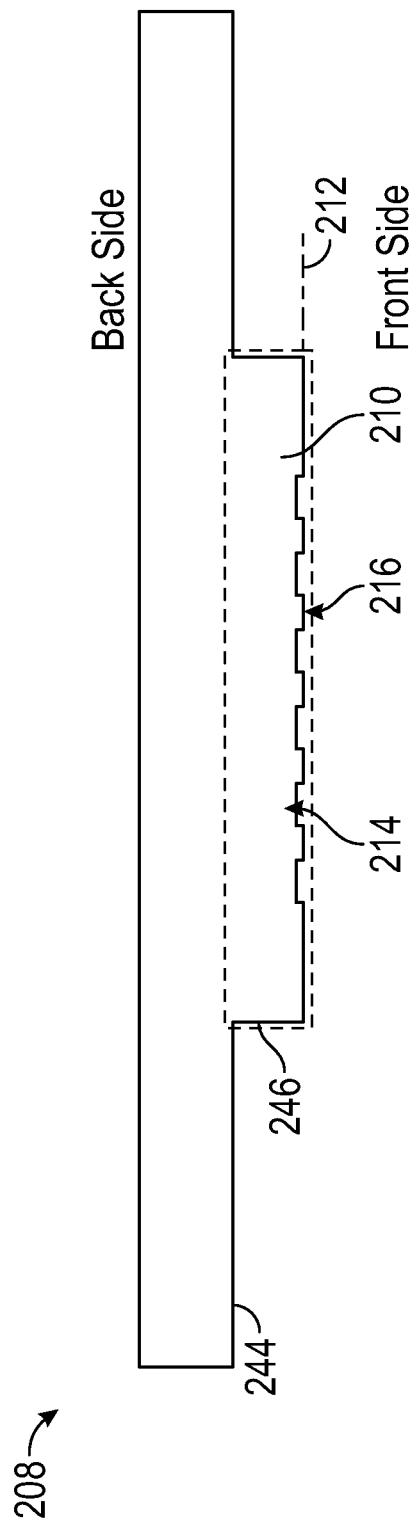
FIG. 2B is an illustration of an exemplary template in accordance with an example embodiment.

FIG. 2B is an illustration of a template 108 that may be used during an imprinting process. The patterning surface 212 may be on a mesa 210 (identified by the dashed box in FIG. 2B). The mesa 210 is surrounded by a recessed surface 244 on the front side of the template. Mesa sidewalls 246 connect the recessed surface 244 to patterning surface 212 of the mesa 210. The mesa sidewalls 246 surround the mesa 210. In an embodiment in which the mesa is round or has rounded corners, the mesa sidewalls 246 refers to a single mesa sidewall that is a continuous wall without corners.

Planarizing Process

Figure 3:
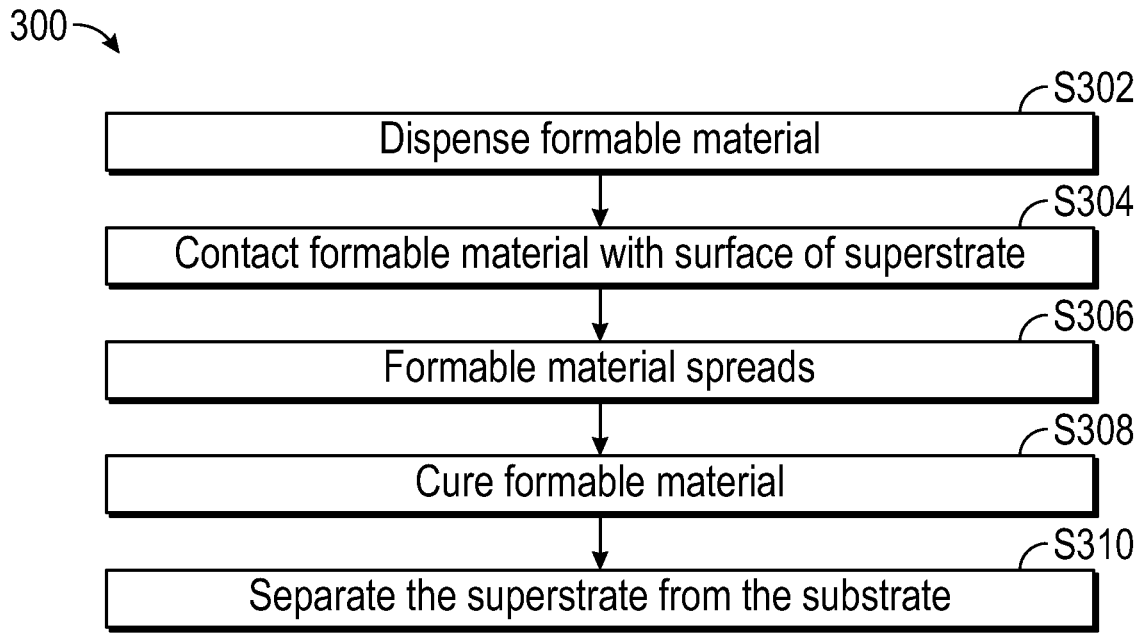
FIG. 3 is a flowchart illustrating an exemplary planarizing method in accordance with an example embodiment.

As noted above, the planarizing system is used to planarize deposited formable material 124. FIG. 3 is a flowchart illustrating an exemplary planarizing process in accordance with an example embodiment. The beginning of the planarizing process 300 may include a superstrate 108 mounting step causing a superstrate conveyance mechanism to mount a superstrate 108 onto the superstrate chuck 118 of the planarizing system 100. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 208 is readily transparent to UV light. The nanofabrication process may also include a substrate mounting step, the processor 140 may cause a substrate conveyance mechanism to mount the substrate 102 onto the substrate chuck 104. The substrate may have one or more coatings and/or structures. The order in which the superstrate 108 and the substrate 102 are mounted onto the nanoimprint lithography system 100 is not particularly limited, and the superstrate and the substrate 102 may be mounted sequentially or simultaneously.

In a dispensing step S302, the processor 140 may cause the fluid dispenser 122 to dispense formable material onto the substrate 102. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The formable material 124 may be ejected on the substrate 102 on a whole wafer basis, which in contrast to a field basis, which is described below with respect to the imprint process. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a superstrate positioning stage to bring the patternless surface 112 of the superstrate 108 into contact with the formable material 124 across the entire substrate.

During a spreading step S306, the formable material 124 then spreads out towards the edge of the substrate. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, superstrate chuck 118, and the planarization head 120 to separate the patterning surface 112 of the template 108 from the cured formable material on the substrate 102.

Imprinting Process

Figure 4:
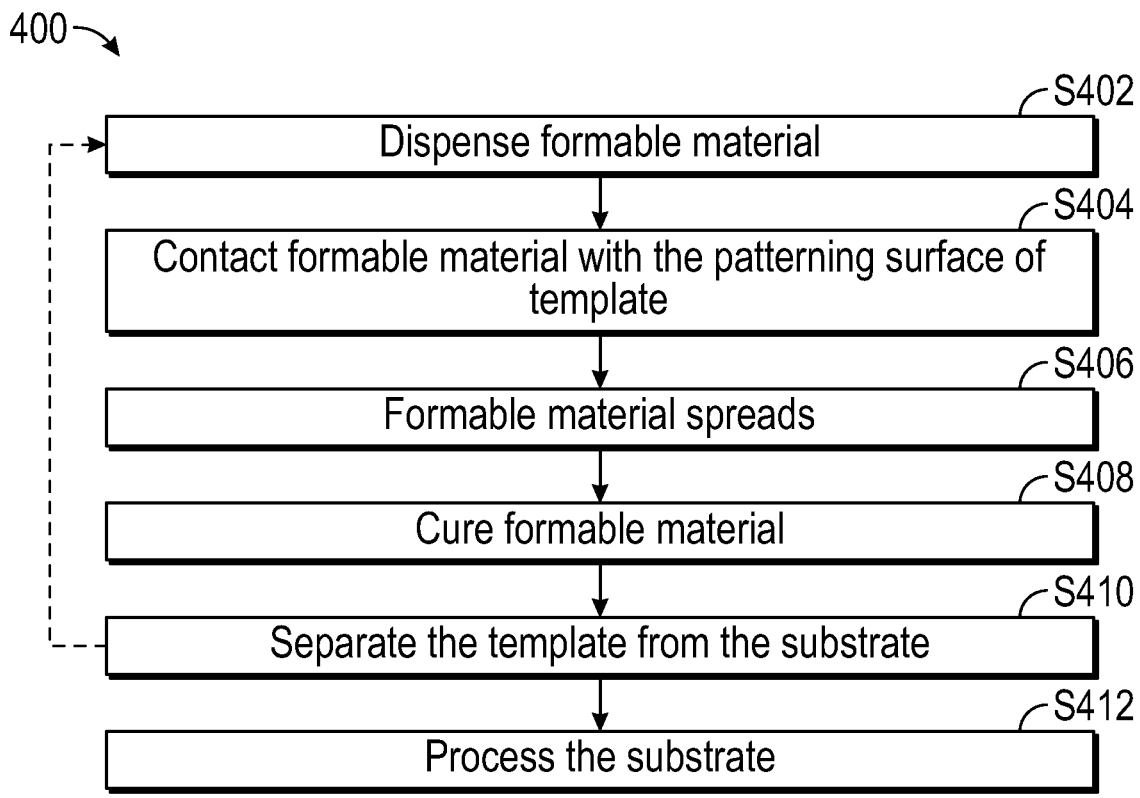
FIG. 4 is a flowchart illustrating an exemplary imprinting method in accordance with an example embodiment.

As noted above, the imprint system 200 is used to form patterns in the formable material 224 on one or more imprint fields (also referred to as: pattern areas or shot areas). FIG. 4 is a flowchart illustrating an exemplary planarizing process in accordance with an example embodiment. The beginning of the imprinting process 400 may include a template mounting step causing a template conveyance mechanism to mount a template 208 onto the template chuck 218. The imprinting process may also include a substrate mounting step, the processor 240 may cause a substrate conveyance mechanism to mount the substrate 102 onto the substrate chuck 204. The substrate 102 may have one or more coatings and/or structures. The order in which the template 208 and the substrate 102 are mounted onto the imprint system 200 is not particularly limited, and the template 208 and the substrate 102 may be mounted sequentially or simultaneously.

In a positioning step, the processor 240 may cause one or both of the substrate positioning stage 206 and/or a dispenser positioning stage to move an imprint field i (index i may be initially set to 1) of the substrate 102 to a fluid dispense position below the fluid dispenser 222. The substrate 102, may be divided into N imprint fields, wherein each imprint field is identified by an index i. In which N is a real integer such as 1, 10, 75, etc. $\{N \in \mathbb{Z}^+\}$. In a dispensing step S402, the processor 240 may cause the fluid dispenser 222 to dispense formable material onto an imprint field i. In an embodiment, the fluid dispenser 222 dispenses the formable material 224 as a plurality of droplets. The fluid dispenser 222 may include one nozzle or multiple nozzles. The fluid dispenser 222 may eject formable material 224 from the one or more nozzles simultaneously. The imprint field i may be moved relative to the fluid dispenser 222 while the fluid dispenser is ejecting formable material 224. Thus, the time at which some of the droplets land on the substrate may vary across the imprint field i. In an embodiment, during the dispensing step S402, the formable material 224 may be dispensed onto a substrate in accordance with a drop pattern. The drop pattern may include information such as one or more of: position to deposit drops of formable material, the volume of the drops of formable material, type of formable material, shape parameters of the drops of formable material, etc.

After, the droplets are dispensed, then a contacting step S404 may be initiated, the processor 240 may cause one or both of the substrate positioning stage 206 and a template positioning stage to bring the patterning surface 212 of the template 208 into contact with the formable material 224 in imprint field i.

During a spreading step S406, the formable material 224 then spreads out towards the edge of the imprint field i and the mesa sidewalls 246. The edge of the imprint field may be defined by the mesa sidewalls 246. How the formable material 224 spreads and fills the mesa can be observed via the field camera 236 and may be used to track a progress of a fluid front of formable material.

In a curing step S408, the processor 240 may send instructions to the radiation source 226 to send a curing illumination pattern of actinic radiation through the template 208, the mesa 210 and the patterning surface 212. The curing illumination pattern provides enough energy to cure (polymerize) the formable material 224 under the patterning surface 212.

In a separation step S410, the processor 240 uses one or more of the substrate chuck 204, the substrate positioning stage 206, template chuck 218, and the imprint head 220 to separate the patterning surface 212 of the template 208 from the cured formable material on the substrate 102.

If there are additional imprint fields to be imprinted then the process moves back to step S402. In an embodiment, additional processing is performed on the substrate 102 in a processing step S412 so as to create an article of manufacture (e.g. semiconductor device). In an embodiment, each imprint field includes a plurality of devices.

The further processing in processing step S412 may include etching processes to transfer a relief image into the substrate that corresponds to the pattern in the patterned layer or an inverse of that pattern. The further processing in processing step S412 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

While the planarizing system 100 and the imprint system 200 are shown and described above with separate processors 140, 240, it should be understood that a single processor may implement the instructions for both systems. Indeed, a single computer system including all of the computer-related hardware described above may be used to control the entire nanofabrication process. Furthermore, while the planarizing system 100 and the imprint system 200 are shown and described above as two separate subsystems, it another embodiment, a single system can comprise all of the aspects of both subsystems. That is, when there are two separate subsystems, the substrate would need to be carried from one subsystem to the other, but in a single system, both the planarizing and the imprinting can be performed sequentially without needing to carry the substrate.

As noted above, the imprint system 200 may have distortion within the system that will negatively impact overlay unless accounted for. Overlay is the registration or alignment of one pattern layer to a second pattern layer and is important for the final article of manufacture (e.g., electronic device) to function correctly. For example, flatness or planarity deviations in the chuck can cause in-plane distortions in the substrate as the substrate conforms to the chuck. Even if the chuck is ideally flat, planarity deviations can exist in the wafer itself that similarly lead to in-plane distortions once the substrate is chucked. Further distortions can be introduced when an imprint template conforms to a non-flat substrate, likewise causing in-plane distortions in the template. These distortions all affect overlay accuracy. U.S. Pat. No. 9,993,962 (the '962 patent) discloses an imprint process that compensates for these distortions, and is incorporated by reference herein. The '962 patent discloses how to generate a particular drop pattern to be dispensed during the imprinting process. In one embodiment, the method disclosed therein includes determining a dispense pattern for the formable material based at least in part on the distortion, wherein the dispense pattern is performed such that the formable material is to be dispensed to a first areal density within a first area, where the distortion indicates that the at least one protrusion and a primary surface of the substrate will be further apart when the template contacts the formable material within the first area; and a second areal density within a second area, where the distortion indicates that the at least one protrusion and the primary surface of the substrate will be closer to each other when the template contacts the formable material within the second area, wherein the first areal density is greater than the second areal density.

As explained in the '962 patent, before determining the dispense pattern, information needs to be collected. The method can include determining a pattern of the mold. The pattern corresponds to the protrusions and recessions on the mold. This determination can be made using the Graphics Data System (GDS) file used in designing and forming the mold. A higher areal density of formable material will be dispensed at locations where recessions in the mold are present, and a lower areal density of formable material will be dispensed at locations where protrusions in the mold are present.

As explained in the '962 patent, the method can include quantifying a distortion within the imprint system. Quantifying the distortion can include determining a deviation in planarity along a surface of a component within the imprint apparatus. The deviation in planarity may be measured as flatness along the primary surface of the chucking region, the primary surface of the substrate, along the primary surface of the mold, or any combination thereof. The flatness is measured along the primary surface of the substrate when it is over the chucking region of the substrate chuck. The flatness may be measured for the entire or nearly the entire substrate (for example, all imprint fields), a single imprint field, a selected combination of imprint fields (for example, the particular imprint field and immediately adjacent imprint fields), or the like. For regions that are lower in elevation, a higher areal density of formable material will be dispensed, and for regions that are higher in elevation, a lower areal density of formable material will be dispensed. The reasoning behind the difference in areal density will be described later in this specification.

As explained in the '962 patent, another distortion can be a magnification or orthogonality distortion. A previously formed pattern in the substrate may be too small or too large as compared to the mold of the template. Such magnification distortions can be quantified by comparing the outer dimensions of the previously formed pattern in the substrate to the outer dimensions of the mold. If the previously formed pattern is too small relative to the mold of the template, a higher density of formable material can be dispensed near the center, as compared to the periphery, of the imprint field to cause the mold to have a concave surface, which reduces the size of the field to be printed within the formable material. If the previously formed pattern is too large relative to the mold of the template, a higher density of formable material can be dispensed near the periphery, as compared to the center, of the imprint field to cause the mold to have a convex surface, which increases the size of the field to be printed within the formable material. Similar approaches can be undertaken to correct for orthogonality distortions, such as skew and trapezoidal distortions.

As explained in the '962 patent, the method can further include determining a dispense pattern for the formable material. Information regarding the pattern of the mold, distortion within the system, and potentially other information is received by the processor from the memory, a metrology tool (for example, an interferometer, a profilometer, or the like), from an external source (for example, a GDS file is in an external memory, not illustrated), state information during exposure (temperature, humidity, energy source, areal energy density during exposure, or the like) or other suitable information that can affect patterning for the formable material.

Additional details for generating a drop pattern to account for imprint system distortion can be found in the '962 patent. However, the '962 patent only discloses using the drop pattern that accounts for imprint system distortion as part of the imprinting process. That is, according to the '962 patent, the drop pattern that is generated to account for imprint system distortion is dispensed on the substrate and contacted with template, etc., as part of the above-described imprinting process 200. While using a drop pattern that accounts for imprint system distortion is beneficial with respect to overlay, there are some disadvantages as well. A more significant disadvantage is that a drop pattern that accounts for imprint system deviation will result in a non-uniform RLT that deviates father from the target uniform RLT as compared to a drop pattern that does not account for imprint system deviation. That is, a drop pattern that does not account for imprint system deviation can be particularly tailored to achieve a RLT that is within a certain deviation from a target uniform RLT. However, by changing the drop pattern to account for imprint system deviation, the drop locations are altered such that the resulting RLT will be non-uniform, i.e., will not be as close to the target uniform RLT as before taking into account the imprint system deviation. In other words, by using a drop pattern taking into account imprint system deviation, the overlay is improved, but the uniformity of the RLT is adversely impacted. The nanofabrication method described herein includes the advantage of accounting for imprint system deviation, while avoiding these disadvantages.

Nanofabrication Method

Figure 5:
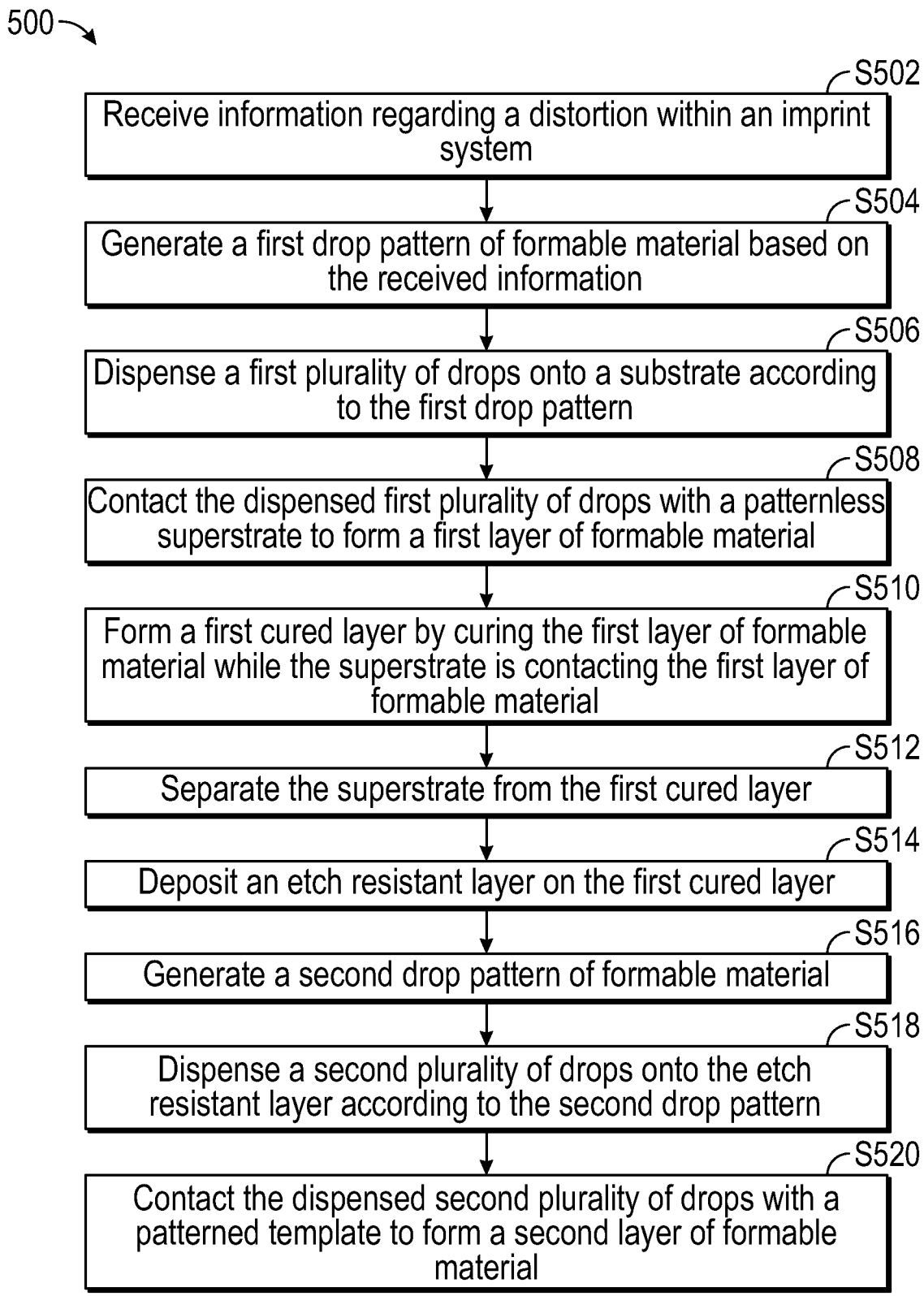
FIG. 5 is a flowchart illustrating an exemplary nanofabrication method in accordance with an example embodiment.

FIG. 5 is a flowchart illustrating an exemplary nanofabrication method 500 in accordance with an example embodiment. FIGS. 6A to 6J are schematic sectional views illustrating the nanofabrication method of FIG. 5. The nanofabrication method begins with step S502, where information regarding a distortion within the imprint system 200 is received. This step is performed in the same manner as the step of "quantifying a distortion within the imprint system" described in the '962 patent, which is incorporated by reference herein. That is, as noted above, following the method set forth in the '962 patent, the distortion with the importing system 200 can be quantified, the details of which are provided in the '962 patent. In particular, as set forth in the '962 patent, the information regarding the distortion within the imprint system may comprise a planar deviation of the substrate, a planar deviation of the template, a planar deviation of a surface of a chuck supporting the substrate, or any combination thereof. While not mentioned in the '962 patent, the information regarding the distortion within the imprint system may also include an image placement deviation of underlying features in an underlying layer of the substrate.

At step S504 a first drop pattern of formable material is generated based on the received information regarding the distortion within the imprint system 200. The first drop pattern comprises a first plurality of drops of formable material 124. The first drop pattern is prepared in a similar manner as the step of "determining a dispense pattern for the formable material" as described in the '962 patent, which is incorporated by reference herein. That is, the step of "determining a dispense pattern for the formable material" described in the '962 patent is the similar to step S504 of the nanofabrication method 500 shown in FIG. 5 in that the first drop pattern is generated based on the received information regarding the distortion within the imprint system 200. However, the steps are different with respect to the other factors taken into consideration when generating the first drop pattern. In particular, because the first drop pattern is dispensed using the planarizing system and contacted with a patternless superstrate in the instant method, the generating of the first drop pattern does not include taking into account a pattern of the template. Rather, the first drop pattern is generated based on a pattern of the substrate without considering the pattern of the template because the pattern of the template is accounted for in the second drop pattern discussed below.

Generating the first drop pattern may include the processor 140 receiving a substrate pattern of the representative substrate 102 in addition to the information regarding distortion in the imprint system. The substrate pattern may include information about substrate topography of the representative substrate, a field of the representative substrate and/or a full field of the representative substrate. The substrate topography may be measured, generated based on previous fabrication steps, and/or generated based on design data. The substrate topography may include information about the shape of an edge such as a beveled edge or a rounded edge of the representative substrate. The substrate topography may include information about a shape and position of a reference edge which surrounds the area of the substrate on which patterns are to be formed. As noted above, generating the first drop pattern does not need to take into account information regarding the template because the second drop pattern takes into account the template information, which is discussed below. For example, the second drop pattern may be generated without taking into the substrate pattern into consideration. That is, the substrate pattern, including information about substrate topography, is not taken into account when generating the second drop pattern.

Once the substrate pattern and the information regarding distortion in the imprint system are received, a processor 140 may calculate a distribution of formable material 124 that will produce a film that fills the volume between the substrate and the surface of the superstrate when the substrate and the superstrate are separated by a gap during planarizing. The distribution of formable material on the substrate may take the form of: an areal density of formable material; positions of droplets of formable material; and/or volume of droplets of formable material. Calculating the distribution of formable material may take into account one or more of: material properties of the formable material, material properties of the superstrate surface, material properties of the substrate surface, spatial variation in volume between the superstrate surface and the substrate surface; fluid flow, evaporation; etc.

Figure 6A:
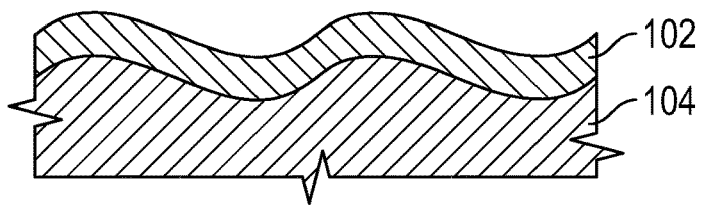
FIGS. 6A to 6J are schematic sectional views illustrating the nanofabrication method of FIG. 5.
Figure 6B:
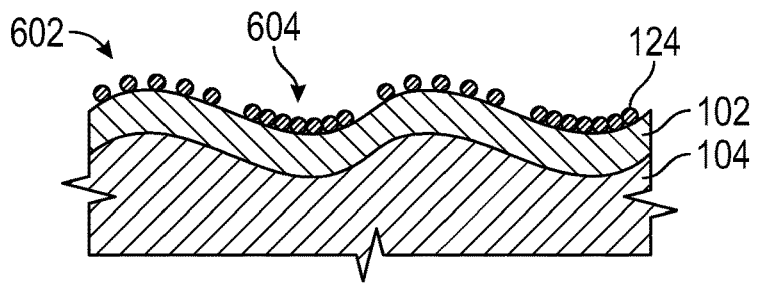

At step S506, the first plurality of drops are dispensed onto the substrate 102 according to the first drop pattern using the planarizing system 100. In this step, the substrate 102 is loaded into the planarizing system 100 and the first plurality of drops are dispensed in the manner described above with respect to the planarizing method 300. That is, step S506 is equivalent to step S302 mentioned above with respect to the planarizing method 300. FIG. 6A shows a schematic sectional view of the substrate 102 coupled with the substrate chuck 104, prior to step S506, i.e., prior to the first plurality of drops of formable material 124 being dispensed. That is, as shown in FIG. 6A there is nothing yet dispensed on the substrate 102. FIG. 6B shows a schematic section view of the substrate 102 after the first plurality of drops have been dispensed onto the substrate according to the first drop pattern via the planarizing system 100. As shown schematically in FIG. 6B, the first drop pattern allows for a different density of drops at different locations on the substrate 102. For example, FIG. 6B shows one example embodiment where the first drop pattern has a first areal density portion 602 and a second areal density portion 604. As shown in FIG. 6B, the first areal density portion 602 is less dense than the second areal density portion 604. Thus, the first drop pattern is not uniform, as is also discussed in '962 patent. While FIG. 6B shows the first plurality of drops being dispensed onto the substrate, in another example embodiment, the substrate may already have one or more layers from a previous fabrication step. Thus, the dispensing of the first plurality of drops may be dispensed onto a preexisting layer instead of being directly deposited onto the substrate surface. Any preexisting layer or layers may already have features within it.

Figure 6C:
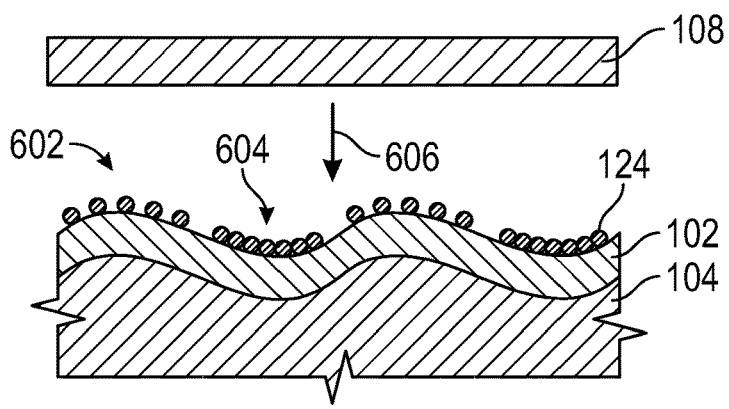
Figure 6D:
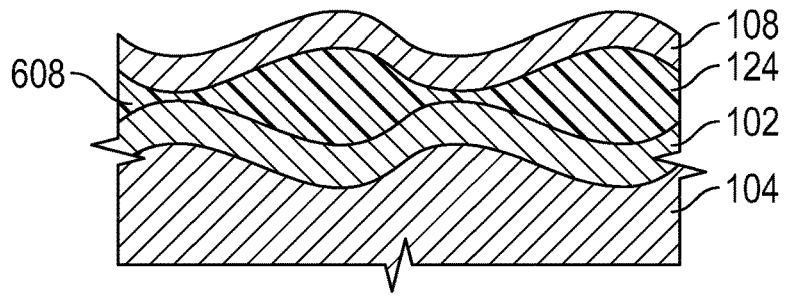

At step S508, the dispensed first plurality of drops are contacted with the superstrate 108 to form a first layer 608 of formable material using the planarizing system 100. This is performed in the manner discussed above with respect to the planarizing method 300. That is, step S508 is equivalent to steps S304 and S306 of the planarizing method 300. FIG. 6C shows a schematic sectional view of the substrate 102 just prior to the superstrate 108 contacting the formable material 124. As indicated by directional arrow 606, the superstrate 108 is brought down toward the substrate 102. FIG. 6D shows a schematic sectional view of the substrate 102 after the superstrate 108 has fully contacted the formable material 124. The contacting of the superstrate 108 with the formable material 124 forms the first layer 608 of formable material 124. This step is also similar to what is described in the '962 patent, except that the '962 patent uses a template with a patterned surface and not a superstrate having a patternless surface. The first drop pattern, having been particularly selected based on counteracting distortion in the imprint system, will induce bending on the superstrate in a desired manner. For example, FIG. 6D shows a moment when the superstrate 108 has been bent due to the different areal densities of formable material. As shown in FIG. 6D, the relative thicknesses of different sections of the first layer 608 induces a bending in the superstrate 108 that mirrors the distortion in the substrate and/or chuck. This is the same principle as described in the '962 patent, but in this case it is applied to the patternless superstrate in the planarizing process and not to a patterned template in an imprinting process.

At step S510, a first cured layer 610 is formed while the superstrate 108 is contacting the first layer 608 of formable material 124 by curing the first layer 608 of formable material 124. The curing step may be performed in the same manner described above in the planarizing method 300. That is, step S510 is equivalent to step S308 in the planarizing method 300. The curing may be precisely controlled to occur at a predetermined time after the first layer 608 of formable material 124 has been formed. In particular, the timing of the curing may be selected such that the moment of curing occurs when the superstrate bending mirrors the distortion in the substrate and/or chuck. In other words, the curing may occur at the moment shown in FIG. 6D, thereby locking in the shape of the first cured layer 610 at that moment as the first layer of formable layer becomes the first cured layer 610.

Figure 6E:
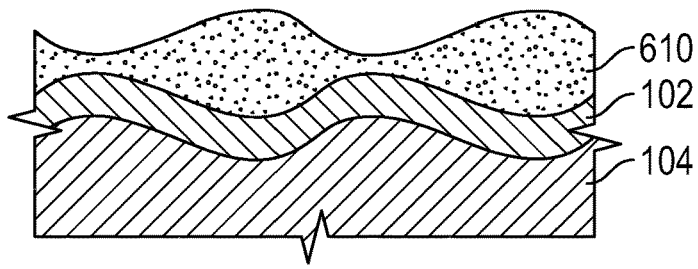

At step S512, the superstrate 108 is separated from the first cured layer 610. FIG. 6E shows the moment after the superstrate 108 has been separated. Thus, in FIG. 6E, only the first cured layer 610 is present on top of the substrate 102. As shown in FIG. 6E, the first cured layer 610 has retained the shape with different thicknesses that mirror the distortion in the substrate and/or chuck.

After step S512, shown in FIG. 6E, the planarizing process is complete. As discussed above, the planarizing process can be performed a whole-substrate basis. That is, the first drop pattern can be dispensed across the entire substrate and the superstrate is large enough to encompass the entire substrate surface. This is in contrast with the imprinting process, which is performed on a field by field basis.

Figure 6F:
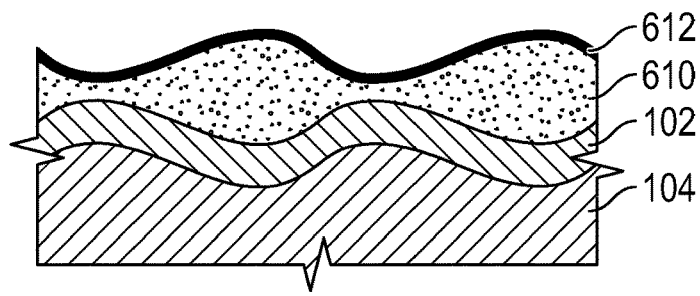

At step S514, an etch resistant layer 612 is deposited on the first cured layer 610. This may be done by physical vapor deposition, chemical vapor deposition, spin-coating, or any other layer forming method known in the art. The etch resistant layer material may be selected such that the cured layers can be selectively etched as compared to the etch resistant layer. That is, certain chemical etchants will etch the cured layers, but will not etch the etch resistant layer. The etch resistant layer may be made from a material selected from the group consisting of silicon dioxide ($SiO_2$) and silicon nitride (SiN). The thickness of the etch resistant layer 612 may be 10-300 nm, for example, 20 nm. FIG. 6F shows the moment after step S514, i.e., after the etch resistant layer 612 as been deposited on the first curd layer 612. As shown in FIG. 6F, the etch resistant layer 612 has the same shape as the first cured layer 610.

At step S516, a second drop pattern of formable material is generated. The second drop pattern can be generated using various ways known in the art. Notably, while the second drop pattern may be based on a variety of factors, none of the factors take into account deviation in the imprint system 200. That is, while the first drop pattern is specifically generated based on the deviation in the imprint system, the second drop pattern is specifically generated without taking deviation in the imprint system 200 into account. In other words, the second drop pattern is generated based on factors that will result in an RLT that is closest to the target uniform RLT and not based on factors that consider deviation in the imprint system 200.

Because the second drop pattern is dispensed using the imprint system and contacted with a patterned template, the generating of the second drop pattern does not include taking into account a pattern of the substrate. Rather, the second drop pattern is generated based on a pattern of the template without considering the pattern of the substrate because the pattern of the substrate is accounted for in the first drop pattern as discussed above. Generating the second drop pattern may include the processor 240 receiving a template pattern of the representative template 208. The template pattern may include information about the topography of the patterning surface 212 of the representative template 208. The topography of the patterning surface 212 may be measured and/or generated based on design data. The patterning surface 212 may be the same size as: an individual full field; multiple fields; the entire substrate, or larger than the substrate. As noted above, generating the second drop pattern does not need to take into account information regarding the substrate because the first drop pattern takes into account the substrate information. Thus, the second drop pattern may be generated without taking into the account the substrate pattern. That is, the substrate pattern, including information about substrate topography, is not taken into account when generating the second drop pattern.

Once the template pattern is received, a processor 240 may calculate a distribution of formable material 224 that will produce a film that fills the volume between the etch resistant layer and the patterning surface when the etch resistant layer and the patterning surface are separated by a gap during imprinting. The distribution of formable material on the etch resistant layer may take the form of: an areal density of formable material; positions of droplets of formable material; and/or volume of droplets of formable material. Calculating the distribution of formable material may take into account one or more of: material properties of the formable material, material properties of the patterning surface, material properties of the etch resistant layer, spatial variation in volume between the patterning surface and the etch resistant layer surface; fluid flow, evaporation; etc.

In one example embodiment, the first formable material and the second formable material may have the same composition. That is, while the first and second drop patterns may be different, the formable material being dispensed may be the same. However, in another embodiment it is also possible for the first formable material and the second formable material have different compositions.

Figure 6G:
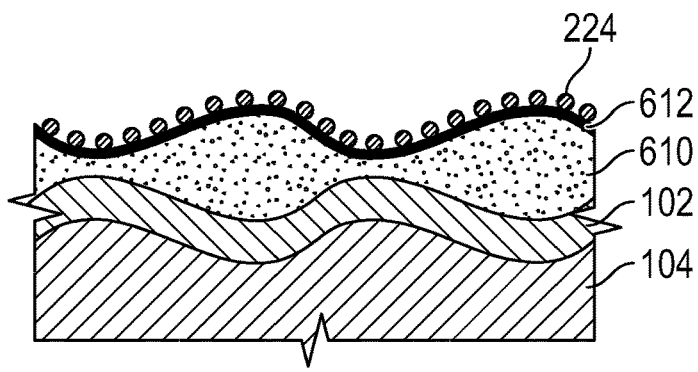

At step S518, the second plurality of drops of formable material 224 are dispensed onto the etch resistant layer 612 according to the second drop pattern using the imprint system 200. In this step, the substrate 102 with the first cured layer 610 and the etch resistant layer 612 is loaded into the imprint system 200 and the first plurality of drops are dispensed in the manner described above with respect to the imprint method 400. That is, step S518 is equivalent to step S402 mentioned above with respect to the imprint method 400. FIG. 6F shows a schematic sectional view of the substrate 102 coupled with the substrate chuck 104, prior to step S518, i.e., prior to the second plurality of drops of formable material 224 being dispensed. FIG. 6G shows a schematic section view of the substrate 102 after the second plurality of drops have been dispensed onto the etch resistant layer 612 according to the second drop pattern via the imprint system 200. As shown schematically in FIG. 6G, the second drop pattern has a uniform density of drops at different locations on the etch resistant layer 612. This is because, as discussed above, the second drop pattern does not take into account deviations in the imprint system 200, and thus does not need areas of different density. Rather, the drop density is uniform because the goal of the second drop pattern is to achieve an RLT as close as possible to a target uniform RLT value.

Figure 6H:
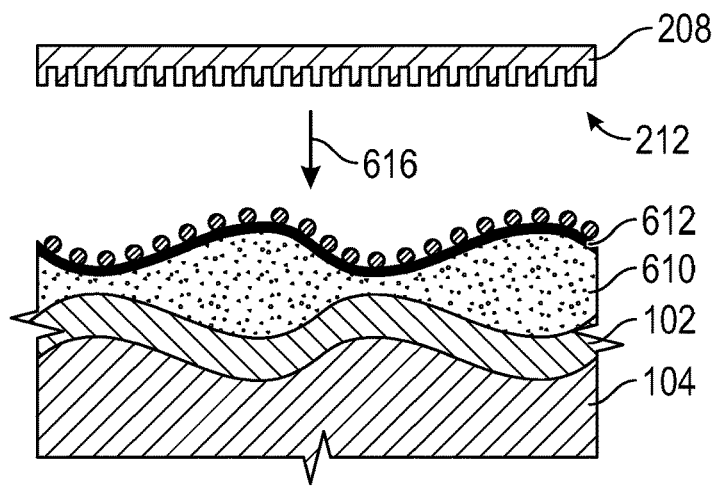
Figure 6I:
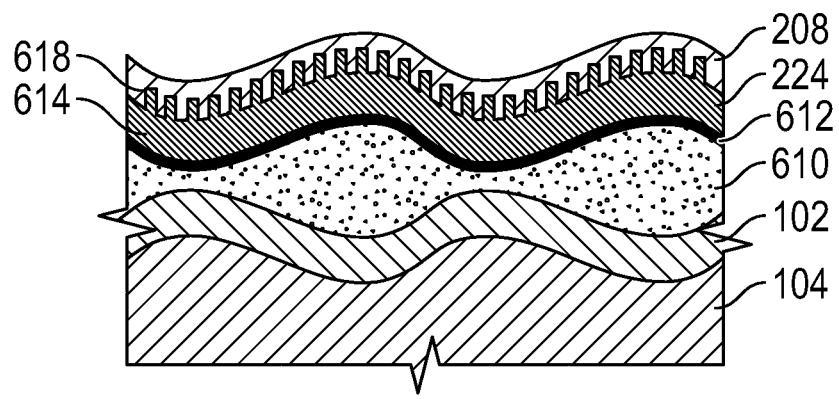

At step S520, the dispensed second plurality of drops are contacted with the template 208 to form a second layer 614 of formable material 224 using the imprint system 200. This is performed in the manner discussed above with respect to the imprint method 400. That is, step S520 is equivalent to steps S404 and S406 of the imprint method 400. FIG. 6H shows a schematic sectional view of the substrate 102 just prior to the template 208 contacting the formable material 224. As indicated by directional arrow 616, the template 208 is brought down toward the substrate 102. FIG. 6I shows a schematic sectional view of the substrate 102 after the template 208 has fully contacted the formable material 224. The contacting of the template 208 with the formable material 224 forms the second layer 614 of formable material 224. As shown in FIG. 6I, during the contacting of the formable material 224 with the template 208, the formable material 224 will fill into the recessed features of the template 208. In this manner the pattern defined by the patterned surface 212 of the template 208 is transferred into the formable material 224, thus forming a plurality of features 618 of formable material 224. As also shown in FIG. 6, as a result of the shape of the etch resistant layer 612 and the shape of the first cured layer 610, the shape of the second layer 614 of formable material 614 conforms to the same shape. In other words, the first cured layer 610 has a shape that induces a planer deviation to the second layer 614 of formable material 224. Thus, it can also be said that the first drop pattern is selected such that the first cured layer 610 has a shape that induces a planer deviation to the second layer 614 of formable material 224. In one example embodiment, the induced planar deviation of the second layer 614 of formable material 224 mirrors the planar deviation of the substrate 102 and/or the substrate chuck 104.

After step S520, a second cured layer 620 is formed while the template 208 is contacting the second layer 614 of formable material 224 by curing the second layer 614 of formable material 224. The curing step may be performed in the same manner described above in the imprint method 400. That is, the curing step equivalent to step S408 in the imprint method 400. The curing sets the shape of the second layer 614 into the second cured layer 620, which including setting the shape of the features 618 into cured features 622.

Figure 6J:
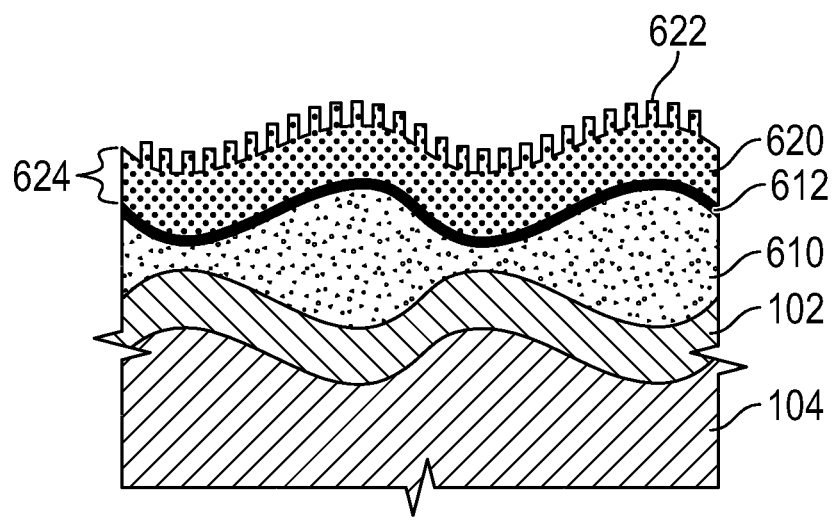

After the curing, the template 208 is separated from the second cured layer 620. FIG. 6J shows the moment after the template 208 has been separated. Thus, in FIG. 6J, the uppermost layer is the second cured layer 620 with cured features 622. The layer immediately below and contacting the second cured layer 620 is the etch resistant layer 612. The layer immediately below and contacting the etch resistant layer 612 is the first cured layer 610. The layer immediately below and contacting the first cured layer 610 is the substrate 102. However, as noted above, in another embodiment, the layer immediately below and contacting the first cured layer 610 may be a layer that was previously formed on the substrate. As shown in FIG. 6J, the second cured layer 620 includes a uniform thickness portion 624 below the cured features 622. This is in contrast to the first cured layer 610 which, as described above, has areas of different thickness. After the separating of the template, the imprint process is complete.

After the imprint process, known etching processes can be used to transfer the pattern defined by the cured features 622 to the substrate 102. By arriving at the structure shown in FIG. 6J, fabrication method 500 provides the benefit of compensating for deviations in the imprint system to improve overlay without the adverse impact on the uniformity of the RLT. This is because the first cured layer 610 formed during the planarizing process provides the compensation for the deviations in the imprint system, while the second cured layer 620 formed during the imprint process provides the uniform target RLT. The use of etch resistant layer 612 allows one to separate the two dispensing steps from each other and also allows one to transfer the pattern, as described below.

Figure 7:
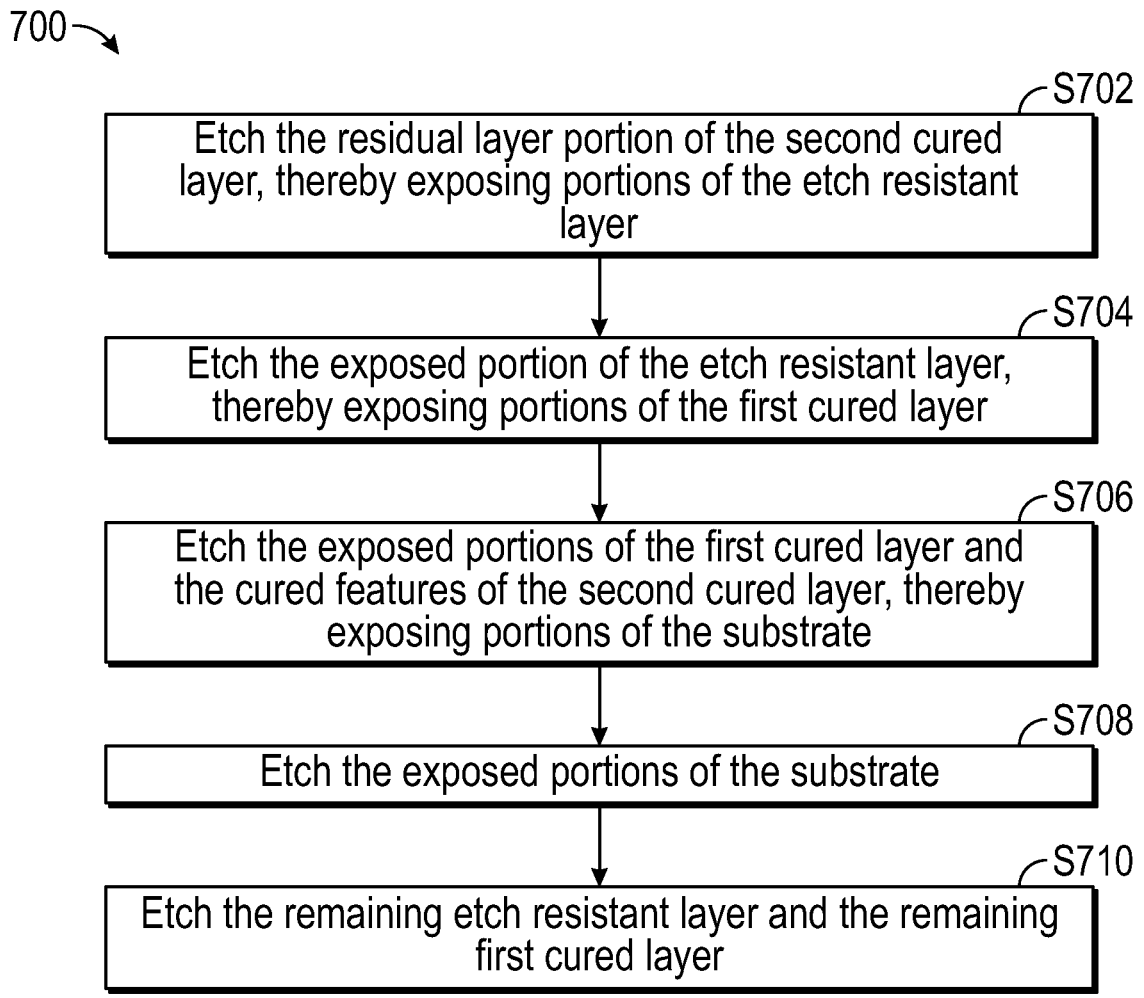
FIG. 7 is a flowchart illustrating an exemplary pattern transfer method in accordance with an example embodiment.
Figure 8A:
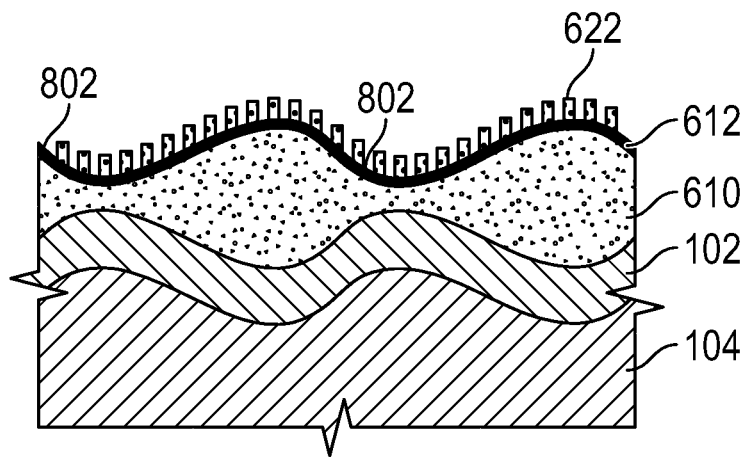
FIGS. 8A to 8E are schematic sectional views illustrating the pattern transfer method of FIG. 7.

FIG. 7 is a flowchart illustrating an exemplary pattern transfer method 700 in accordance with an example embodiment. FIGS. 8A to 8E are schematic sectional views illustrating the pattern transfer method of FIG. 7. The etching process may be performed as follows. Starting with the structures shown in FIG. 6J, a first etching step S702 may be performed in which the residual layer portion 624 of the second cured layer 620 is etched away. This etching can be performed by using a first etching compound that removes the residual layer portion 624 leaving behind the cured features 622. However, the first etching compound may be selected such that while it is capable of etching the material of the residual layer portion 624, it is not capable of etching the material of the etch resistant layer 612. For example, the first etching compound may be selected from an oxygen-containing gas, such as $O_2$, $O_3$, $N_2O$, or the like. The application of the etching compound may be precisely controlled so that only the residual layer portion 624 is removed, without removing the cured featured 622. FIG. 8A shows a schematic sectional view of the structure after the residual layer portion 624 has been removed by chemical etching. As seen in FIG. 8A, the cured features 622 are located on the etch resistant layer 612 after the residual layer portion 624 has been removed. As also shown in FIG. 8A, with the residual layer portion 624 removed, portions 802 of the etch resistant layer 612 are now exposed. That is, etch resistant layer 612 is no longer covered in the portions 802, but is still covered at the locations of the cured features 622.

Figure 8B:
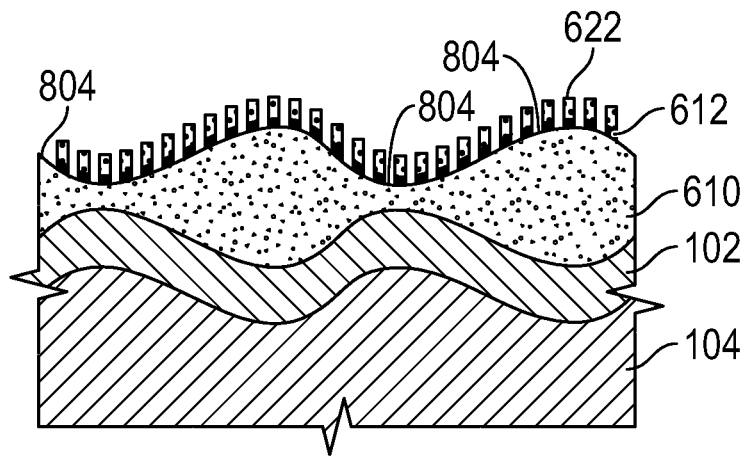

A second etching step S704 may then be performed where the exposed portions 802 of the etch resistant layer 612 are etched. In this case, a second etching compound is used that is different from the first etching compound. The second etching compound is capable of removing the material of the etch resistant layer 612, but is not capable of removing the cured features 622. For example, the second etching compound may be selected from a fluorine-based chemical, for example gases such as $CF_4$, $CHF_3$, $SF_6$, or the like. A liquid etchant may be a buffered HF solution, for example $NH_4F$. The second etching may be controlled to stop after removing the exposed portions 802 of the etch resistant layer 612. FIG. 8B shows a schematic sectional view of the structure after the exposed portions 802 of the etch resistant layer 612 have been removed by the second chemical etching. As seen in FIG. 8B, the cured features 622 are still located on the etch resistant layer 612 after the exposed portions 802 have been removed. As also shown in FIG. 8B, in the areas where the exposed portions 802 used to be, now the second cured layer 610 is deposed at exposed portions 804. That is, second cured layer 610 is no longer covered at the portions 804, but is still covered at the locations of the cured features 622 and the etch resistant layer 612. The areas of the each resistant layer 612 that are still present after the second etching is because these areas are protected by the cured feature 622. That is, because the cured features 622 are on top of the etch resistant layer 612, those areas of the etch resistant layer 612 will not come into contact with the second etching compound.

Figure 8C:
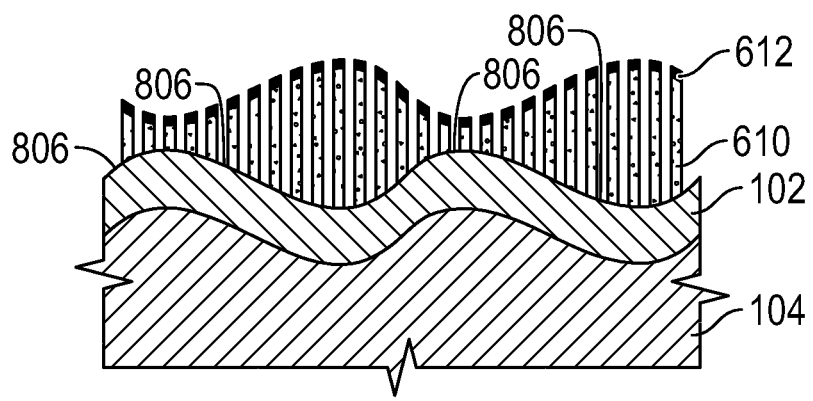

A third etching step S706 may then be performed where the exposed portions 804 of the first cured layer 610 and also the cured features 622 are etched. In this case, first etching compound can once again be used. As noted above, the first etching compound is capable of etching the material of the residual layer portion 624, it is not capable of etching the material of the etch resistant layer 612. As also noted above, in an example embodiment the first cured layer 610 is made from the same formable material as the second cured layer 620. Thus, the first etching compound will remove both the exposed portions 804 of the first cured layer 610 and also the cured feature 622, but will not remove the etch resistant layer 612. The third etching may be controlled to stop after removing the exposed portions 804 of the first cured layer 610. FIG. 8C shows a schematic sectional view of the structure after the cured features 622 and the exposed portions 804 of the first cured layer 610 are removed by the third chemical etching step. As seen in FIG. 8C, some of the etch resistant layer 612 is still present on top of some portions of the first cured layer after the exposed portions 804 of the first cured layer 610 have been removed. As also shown in FIG. 8C, in the areas where the exposed portions 804 used to be, now portions 806 of the substrate 102 are exposed. That is, the substrate 102 is no longer covered at the portions 806, but is still covered at the locations where the etch resistant layer 612 remains on top of the remaining first cured layer 610. The areas of the first cured layer 610 that are still present after the third etching is because these areas are protected by the remaining portions of the etch resistant layer 612. That is, because portions of the etch resistant layer 612 are on top of portion of the first cured layer 610, those areas of the first cured portion 610 will not come into contact with the first etching compound.

Figure 8D:
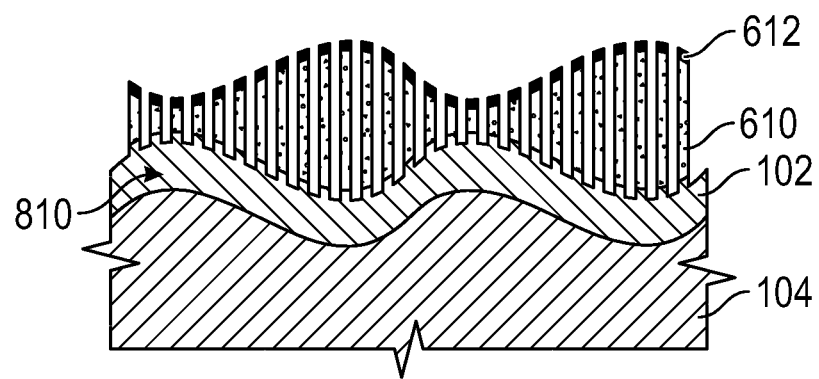

A fourth etching step S708 may then be performed where the exposed portions 806 of the substrate 102 are etched. In this case, a third etching compound can be used. The third etching compound is capable of etching the material of the substrate 102, but it is not capable of etching the material of the etch resistant layer 612. The fourth etching may be controlled to stop after removing a predetermined amount of the substrate 102. FIG. 8D shows a schematic sectional view of the structure after the exposed portions 806 of the substrate 102 are removed by the fourth chemical etching step. As seen in FIG. 8D, some of the etch resistant layer 612 is still present on top of some portions of the first cured layer after the exposed portions 804 of the first cured layer 610 have been removed. As also shown in FIG. 8D, the substrate 102 now has a pattern 810 after some of substrate at the exposed portions 806 have been etched. Thus, by following the etching steps described above, the substrate 102 ultimately has a pattern 810 corresponding to the pattern 212 of the template 208. The same areas of the first cured layer 610 of FIG. 8C are still present after the fourth etching because these areas are still protected by the remaining portions of the etch resistant layer 612. That is, because portions of the etch resistant layer 612 are on top of portion of the first cured layer 610, those areas of the first cured portion 610 will not come into contact with the third etching compound during the fourth etching step.

Figure 8E:
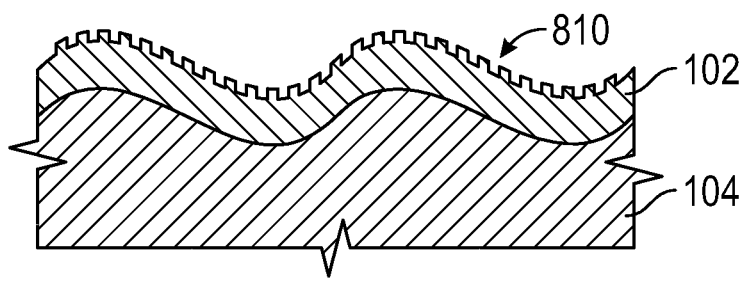

Further etching steps S710 may then be performed to clean off the remaining materials present on the substrate 102. The above-described second etching compound may be used to remove the remaining etch resistant layer 612 and then the above-descried first etching compound may be used to remove the remaining first cured layer. After these excess materials have been removed, the completed substrate 102 with pattern 810 is acquired. FIG. 8E shows a schematic sectional view of the structure after the remaining etch resistant layer 612 and remaining first cured layer 610 are removed by the further etching steps. As seen in FIG. 8E, the processed substrate has the pattern 810 formed on the surface, where the pattern 810 corresponds to the pattern 212 of the template 208.

As discussed above, the nanofabrication method disclosed herein provides the benefit of compensating for deviations in the imprint system to improve overlay without the adverse impact on the uniformity of the RLT. As provided above, this is because the first cured layer formed during the planarizing process provides the compensation for the deviations in the imprint system, while the second cured layer formed during the imprint process provides the uniform target RLT. The use of etch resistant layer allows one to separate the two dispensing steps from each other and also allows one to transfer the pattern. As a result of using the fabrication method described herein, the overlay error between the second cured layer and an underlying layer of the substrate is less than 10 nm.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A nanofabrication method comprising:
   receiving information regarding a distortion within an imprint system;
   generating a first drop pattern of formable material based on the received information, the first drop pattern comprising a first plurality of drops of formable material;
   dispensing the first plurality of drops onto a substrate according to the first drop pattern;
   contacting the dispensed first plurality of drops with a superstrate to form a first layer of formable material, the superstrate being patternless, wherein the dispensed first plurality of drops induces bending of the superstrate;
   forming a first cured layer by curing the first layer of formable material while the superstrate is contacting the first layer of formable material having a thickness corresponding to the bending of the superstrate;
   separating the superstrate from the first cured layer;
   depositing an etch resistant layer on the first cured layer;
   generating a second drop pattern, the second drop pattern comprising a second plurality of drops of formable material;
   dispensing the second plurality of drops onto the etch resistant layer according to the second drop pattern; and
   contacting the dispensed second plurality of drops with a template to form a second layer of formable material, the template having a pattern.

2. The nanofabrication method of claim 1, wherein the second drop pattern is different from the first drop pattern.

3. The nanofabrication method of claim 1, wherein the second drop pattern is generated based on a target uniform residual layer thickness.

4. The nanofabrication method of claim 1, wherein the second drop pattern is generated without taking into account the distortion within the imprint system.

5. The nanofabrication method of claim 1,
   wherein the first drop pattern is generated based on a pattern of the substrate, and
   wherein the second drop pattern is generated based on a pattern of the template.

6. The nanofabrication method of claim 1, wherein first drop pattern is selected such that the first cured layer has a shape that induces a planer deviation to the second layer of formable material.

7. The nanofabrication method of claim 6, wherein the induced planar deviation of the second layer of formable material mirrors the planar deviation of the substrate.

8. The nanofabrication method of claim 1, wherein the formable material of the first drop pattern is the same as the formable material of the second drop pattern.

9. The nanofabrication method of claim 1, wherein the formable material of the first drop pattern is different from the formable material of the second drop pattern.

10. The nanofabrication method of claim 1, wherein the contacting of the template with the dispensed second plurality of drops imprints a pattern in the second layer of formable material.

11. The nanofabrication method of claim 1, further comprising forming a second cured layer by curing the second layer of formable material while the template is contacting the second layer of formable material.

12. The nanofabrication method of claim 11, further comprising transferring the pattern in the second formable layer to the substrate.

13. The nanofabrication method of claim 12, wherein the transferring of the pattern comprises:
   etching the second cured layer to expose portions of the etch resistant layer;
   etching the exposed portions of the etch resistant layer to expose portions of the first cured layer;
   etching the exposed portions of the first cured layer to expose portions of the substrate; and
   etching the exposed portions of the substrate.

14. The nanofabrication method of claim 13,
   wherein the etching of the second cured layer comprises exposing the second cured layer to a first etching compound,
   wherein the etching of the etch resistant layer comprises exposing the etch resistant layer to a second etching compound different from the first etching compound, and
   wherein the etch resistant layer is not capable of being etched by the first etching compound.

15. The nanofabrication method of claim 14,
   wherein the etching of the first cured layer comprises exposing the first cured layer to the first etching compound.

16. The nanofabrication method of claim 1, wherein the information regarding the distortion within the imprint system comprises a planar deviation of the substrate, a planar deviation of the template, a planar deviation of a surface of a chuck supporting the substrate, image placement deviation of underlying features in an underlying layer of the substrate, or any combination thereof.

17. The nanofabrication method of claim 1, wherein the imprint system comprises the substrate, the superstrate, and the template.

18. The nanofabrication method of claim 1, wherein an overlay error between the second cured layer and an underlying layer of the substrate is less than 10 nm.

19. A method of making an article, comprising:
   receiving information regarding a distortion within an imprint system;
   generating a first drop pattern of formable material based on the received information, the first drop pattern comprising a first plurality of drops of formable material;
   dispensing the first plurality of drops onto a substrate according to the first drop pattern;
   contacting the dispensed first plurality of drops with a superstrate to form a first layer of formable material, the superstrate being patternless, wherein the dispensed first plurality of drops induce bending of the superstrate;
   forming a first cured layer by curing the first layer of formable material while the superstrate is contacting the first layer of formable material having a thickness corresponding to bending of the superstrate;
   separating the superstrate from the first cured layer;
   depositing an etch resistant layer on the first cured layer;
   generating a second drop pattern, the second drop pattern comprising a second plurality of drops of formable material;
   dispensing the second plurality of drops onto the etch resistant layer according to the second drop pattern;
   contacting the dispensed second plurality of drops with a template to form a second layer of formable material, the template having a pattern;
   forming the pattern in the second layer of formable material as a result of completing the contacting of the template with the dispensed second plurality of drops;
   transferring the pattern in the second layer of formable material to the substrate; and
   processing the substrate to make the article.

* * * * *